United States Patent
Park et al.

(10) Patent No.: US 9,972,559 B2
(45) Date of Patent: May 15, 2018

(54) SIGNAL BLOCK AND DOUBLE-FACED COOLING POWER MODULE USING THE SAME

(71) Applicant: Hyundai Motor Company, Seoul (KR)

(72) Inventors: Sung Won Park, Incheon (KR); Woo Yong Jeon, Seoul (KR); Jeong Min Son, Gyeonggi-Do (KP)

(73) Assignee: Hyundai Motor Company, Seoul (KR)

( * ) Notice: Subject to any disclaimer, the term of this patent is extended or adjusted under 35 U.S.C. 154(b) by 0 days. days.

(21) Appl. No.: 15/287,136

(22) Filed: Oct. 6, 2016

(65) Prior Publication Data

US 2017/0338168 A1  Nov. 23, 2017

(30) Foreign Application Priority Data

May 19, 2016  (KR) ........................ 10-2016-0061349

(51) Int. Cl.
| | |
|---|---|
| *H01L 23/48* | (2006.01) |
| *H01L 23/495* | (2006.01) |
| *H01L 23/40* | (2006.01) |
| *H02M 7/00* | (2006.01) |
| *H01L 23/051* | (2006.01) |
| *H01L 23/433* | (2006.01) |

(52) U.S. Cl.
CPC ...... *H01L 23/49524* (2013.01); *H01L 23/051* (2013.01); *H01L 23/4093* (2013.01); *H01L 23/49558* (2013.01); *H01L 23/49562* (2013.01); *H01L 23/49568* (2013.01); *H02M 7/003* (2013.01); *H01L 23/4334* (2013.01); *H01L 2224/48091* (2013.01); *H01L 2224/48998* (2013.01); *H01L 2224/73265* (2013.01)

(58) Field of Classification Search
CPC ........... H01L 23/49524; H01L 23/4093; H01L 23/49558; H01L 23/49568; H02M 7/003
See application file for complete search history.

(56) References Cited

U.S. PATENT DOCUMENTS

| | | | | |
|---|---|---|---|---|
| 2008/0246137 A1* | 10/2008 | Mahler | ............. | H01L 23/49524 257/690 |
| 2009/0121330 A1* | 5/2009 | Cruz | ................. | H01L 23/49503 257/676 |
| 2010/0232131 A1* | 9/2010 | Qian | ................. | H01L 23/49524 361/813 |
| 2013/0049183 A1* | 2/2013 | Yao | .................... | H01L 23/49537 257/676 |

(Continued)

FOREIGN PATENT DOCUMENTS

| | | |
|---|---|---|
| JP | H05152365 A | 6/1993 |
| JP | 2013-069425 A | 4/2013 |

(Continued)

*Primary Examiner* — Joseph C Nicely
*Assistant Examiner* — Wilner Jean Baptiste
(74) *Attorney, Agent, or Firm* — Mintz Levin Cohn Ferris Glovsky and Popeo, P.C.; Peter F. Corless

(57) ABSTRACT

A signal block and a double-faced cooling power module that uses the signal block is provided. The signal block includes a plurality of signal clips that are formed in a ribbon shape to connect a first signal pad formed on a semiconductor chip and a second signal pad formed on a signal lead frame. An insulator fixes the position of the plurality of signal clips while spacing the signal clips apart from each other.

11 Claims, 13 Drawing Sheets

(56) References Cited

U.S. PATENT DOCUMENTS

2014/0197525 A1 7/2014 Kadoguchi et al.
2015/0145110 A1* 5/2015 Luan .................. H01L 24/83
　　　　　　　　　　　　　　　　　　　257/666

FOREIGN PATENT DOCUMENTS

KR　10-2012-0079325 A　7/2012
KR　10-2013-0086687　　8/2013

* cited by examiner

SIGNAL BLOCK AND DOUBLE-FACED COOLING POWER MODULE USING THE SAME

CROSS REFERENCE TO RELATED APPLICATION

The present application claims priority to Korean Patent Application No. 10-2016-0061349, filed May 19, 2016, the entire contents of which is incorporated herein for all purposes by this reference.

BACKGROUND

Field of the Invention

The present invention relates generally to a signal block and a double-faced cooling power module using the signal block and, more particularly, to a signal block produced using clips and a double-faced cooling power module having the signal block.

Description of the Related Art

Generally, a hybrid power control unit (HPCU), which is a power inverter, has been used in environment-friendly vehicles (e.g., a hybrid vehicle and an electric vehicle). Among elements of the HPCU, a power module contributes to a considerable portion of the total cost of the HPCU. Accordingly, many technologies are being researched to increase the power output, reduce the size, and reduce the cost. Based on recent technological trend development, the power quantity applied to the power module has been rapidly increasing. Additionally, the size of the power module is also being reduced. Accordingly the increased output of power and the reduction in the size of the power module has contributes to electric power exceeding the existing power module requirement and therefore, the elements thereof may be thermally damaged due to overheating caused by the excessive electric power, which reduces the lifespan of the elements.

As shown in FIG. 1, in an existing power module, a semiconductor chip 30 and lead frames 20 are electrically connected to each other using wires 50 formed from an aluminum material. In particular, the lead frames 20 are elements used to transmit and receive signals relative to the semiconductor chip 30 of the power module and to supply electric power to the semiconductor chip 30. The lead frames 20 include a signal lead frame 21 configured to transmit and receive signals to and from the semiconductor chip 30. A power lead frame 22 is configured to supply electric power to the semiconductor chip 30. In the related art, each of the signal lead frame 21 and the power lead frame 22 is produced in a single structure and surplus components of the lead frames 21 and 22 are removed by cutting after connecting the lead frames 21 and 22 to the semiconductor chip 30.

Additionally, the wires 50 include signal wires 51 that connect the signal lead frame 21 and the semiconductor chip 30 to each other and are configured to transmit signals between the signal lead frame 21 and the semiconductor chip 30. Further, power wires 52 and 53 connect the power lead frame 22 and the semiconductor chip 30 and are configured to supply electric power to the semiconductor chip 30. When a plurality of power pads are disposed on the semiconductor chip 30, a primary wire connection is provided between the power lead frame 22 and the power pads of the semiconductor chip 30 using the power wires 53. A second wire connection is provided between the power pads of the semiconductor chip 30 using the power wires 52. For example, the power wires 52 and 53 are integrated into a single wire or include a plurality of wires separated from each other.

In the related art, when the aluminum wires 50 are used, due to the narrow cross-sectional area thereof, the amount of heat produced by the operation of the power module is increased, and the thermal damage to the aluminum wire may occur due to the characteristics of the material. Additionally, a bent portion of the aluminum wire is formed in an are shape, thus a clearance space that prevents the wire from interfering with other elements is required. Accordingly, the development of a double-faced cooling structure that realizes a reduction in the size of the power module and restricts the generation of heat caused by excessive electric power is limited.

Due to the limitations of the connection using the aluminum wire, clip bonding using a thin copper ribbon as a connection technology to connect a lead frame and a semiconductor chip has been proposed. Since the clip bonding uses a copper material that has improve heat resistance compared to an aluminum material, the clip bonding increases the lifespan of the power module. A power module using a power clip 60 is shown in FIG. 2. As shown in FIG. 2, the connection between a power lead frame 22 and a semiconductor chip 30 using the power clip 60 includes a large thin ribbon shape coupled to a power pad with an increased size. Accordingly, the connection between the power lead frame 22 and the semiconductor chip 30 is formed using the clip 60. However, the size of a signal pad remains small, the number of signal pads is large, and the signal pads are placed at irregular locations. Accordingly, it may be difficult to perform clip bonding for the signal pads and aluminum signal wires are used to connect the semiconductor chip 30 to a signal lead frame 21 even when using the power clip 60.

However, as shown in FIG. 3 of the related art when a power module has a complex configuration that includes a power clip and signal wires has the complex configuration having the power clip and the signal wires applied to a double-faced cooling power module, the signal wires 51 contact a board 10. Accordingly, an electric current is transmitted between the signal wires and the board. As a result, there is a need for new technology to connect a semiconductor chip by clip bonding to a signal lead frame having a relatively complicated configuration.

The foregoing is intended merely to aid in the understanding of the background of the present invention, and is not intended to mean that the present invention falls within the purview of the related art that is already known to those skilled in the art.

SUMMARY

The present invention provides a signal block and a double-faced cooling power module that connects a signal lead frame to a semiconductor chip using copper clips instead of aluminum wires. In one aspect of the present invention, a signal block for a power module may include a plurality of signal clips formed in a thin ribbon shape to connect first signal pads formed on a semiconductor chip and second signal pads formed on a lead frame and an insulator that fixes the position of the plurality of signal clips and spaces the signal clips apart from each other.

Each of the signal clips may be formed in a thin copper ribbon, and may be disposed to be spaced apart from a board connected to the semiconductor chip. The insulator may have a width greater than a sum of widths of the plurality of signal clips and may have a thickness greater than each of the signal clips. Accordingly, contact of the plurality of signal clips may be prevented with the board. The insulator may be coupled to the board. The insulator may hold the plurality of the signal clips and may space the signal clips apart from each other when the insulator covers central portions of the plurality of signal clips and exposes opposite ends of each of the signal clips.

According to another aspect of the present invention, a double-faced cooling power module with a semiconductor chip disposed between first and second boards may include a signal block in which the semiconductor chip and a lead frame may be connected to each other by a signal clip having a thin ribbon shape and may be configured to transmit and receive a signal. A power clip may be coupled to the semiconductor chip and may be configured to supply electric power.

The signal clip may be formed in a thin copper ribbon and may be spaced apart from the first and second boards. The signal clip may include a plurality of signal clips. A first end of each of the signal clips may be coupled to the semiconductor chip and a second end of each of the signal clips may be coupled to the lead frame. The signal block may further include an insulator to fix the position of the plurality of signal clips and space the signal clips apart from each other. The insulator may have a width greater than a sum of widths of the plurality of signal clips and may have a thickness greater than each of the signal clips. Accordingly, contact may be prevented between the plurality of signal clips and the first and second boards. The insulator may be coupled to either or both of the first and second boards.

The semiconductor chip may include a plurality of first signal pads on a first side of a flat surface thereof and a power pad on a second side of the flat surface. The lead frame may include a plurality of second signal pads on a surface thereof. The semiconductor chip may be coupled to a flat surface of the first board, the power clip may be coupled to the power pad, and the second board may be coupled to a flat surface of the power clip. The plurality of signal clips may couple the plurality of first signal pads and the plurality of second signal pads to each other, respectively.

According to the present invention having the above-mentioned configuration, the signal block and the double-faced cooling power module using the signal block may provide the following advantages.

First, the size of the power module may be reduced by reducing total thickness of the power module via clip bonding.

Second, the production time of the power module may be reduced by using a signal block prepared in advance.

Third, the signal clip may be held in a fixed position by using an insulator. Accordingly, the clip bonding may also be performed for a connection terminal having a complex configuration.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Figure 1:
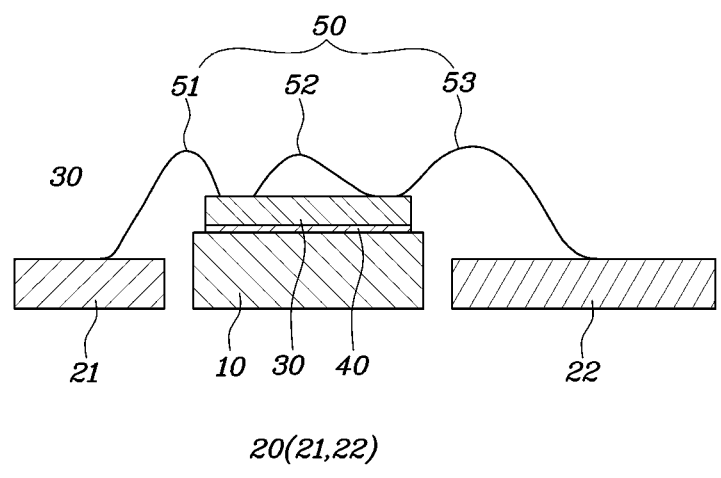
FIG. 1 is an exemplary view showing the cross-section of a conventional power module using aluminum wires according to the related art.
Figure 2:
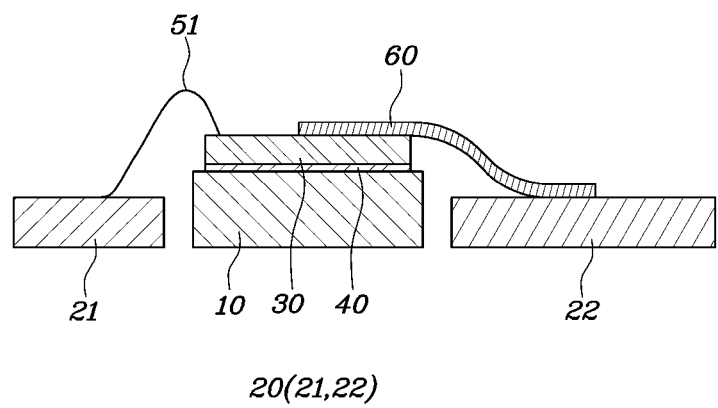
FIG. 2 is an exemplary view showing the cross-section of a conventional power module using a copper clip instead of a power connection wire according to the related art.
Figure 3:
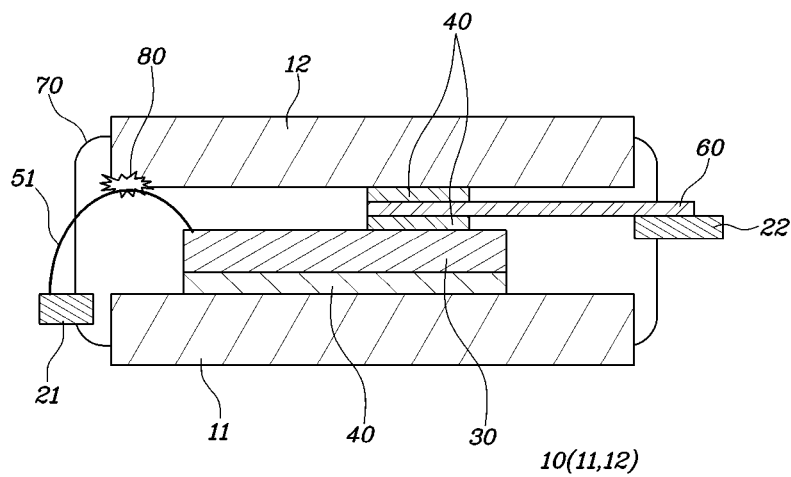
FIG. 3 is an exemplary view showing a conventional double-faced cooling power module whereby a signal wire contacting with a board is illustrated according to the related art.

Hereinafter, the exemplary embodiment of the present invention will be described in detail with reference to the accompanying drawings to allow those skilled in the art to easily practice the present invention. Advantages and features of the present invention and methods for achieving the same will be clearly understood with reference to the following detailed description of embodiments in conjunction with the accompanying drawings. However, the present invention is not limited to the embodiments disclosed herein, but may be implemented in various different forms. The embodiments are merely given to make the disclosure of the present invention complete and to completely instruct the scope of the invention to those skilled in the art, and the present invention should be defined by the scope of the claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. The terminology used herein is for the purpose of describing particular aspects (or embodiments) only and is not intended to be limiting of the present invention. As used herein, the singular forms are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Hereinbelow, signal blocks and double-faced cooling power modules using the signal blocks according to the exemplary embodiments of the present invention will be described with reference to the accompanying drawings. First, a signal block will be described. As shown in FIGS. 7A to 8C, the signal block according to the present invention may include signal clip 100 and an insulator 200. The signal clip 100 may be formed of a thin copper ribbon and may be formed to have a thickness that is less than the thickness of an aluminum wire. In other words, an arced portion of a conventional aluminum wire does not appear in the signal clip 100. Accordingly, the total thickness of the power module may be reduced. However, the width of the signal clip 100 may be greater than the conventional aluminum wire. In particular, a plurality of signal clips may be disposed side by side and the signal clips may contact or interfere with each other. For example, an aluminum wire is about 250 μm or less in diameter, a signal clip is about 300-500 μm in width.

Accordingly, the signal block of the present invention may include an insulator 200 that fixes the position of the plurality of the signal clips while spacing the signal clips apart from each other. The insulator 200 may be formed from an insulation material and may have a brick shape (e.g., or alternate 3D rectangular geometry). In particular, the plurality of signal clips 100 may penetrate the insulator 200 to prevent the signal clips 100 from contacting each other. Further, the central portions of the signal clips 100 may be held in a fixed position by the insulator 200 and the opposite ends of each signal clip 100 may be deformed freely. In particular, the opposite ends of the signal clips 100 may be in contact with first and second signal pads 31 and 23 disposed on a semiconductor chip 30 and on a signal lead frame 21 by a transformation of the shape of the signal clips 100.

Figure 7A:
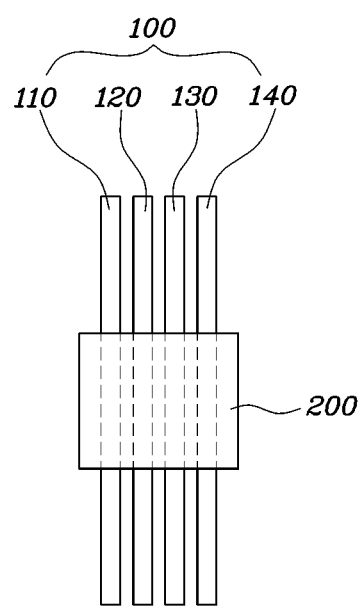
FIGS. 7A to 7D are exemplary views showing signal blocks according to exemplary embodiments of the present invention.
Figure 7B:
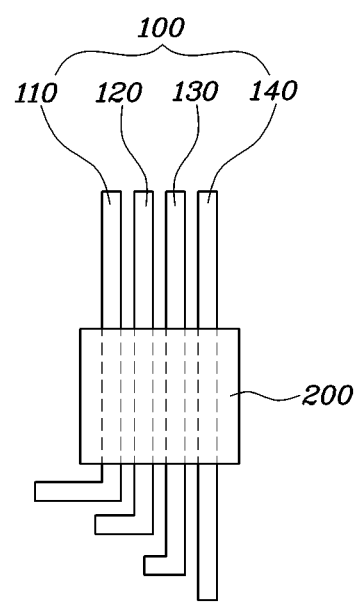
Figure 7C:
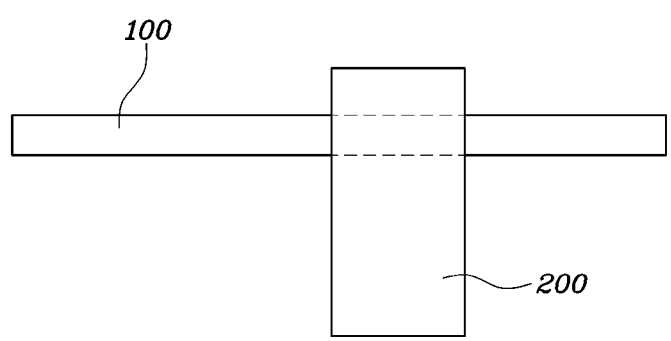
Figure 7D:
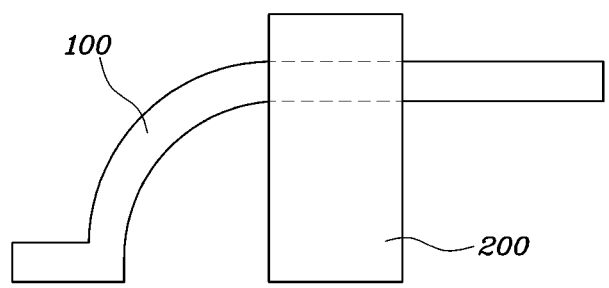
Figure 8A:
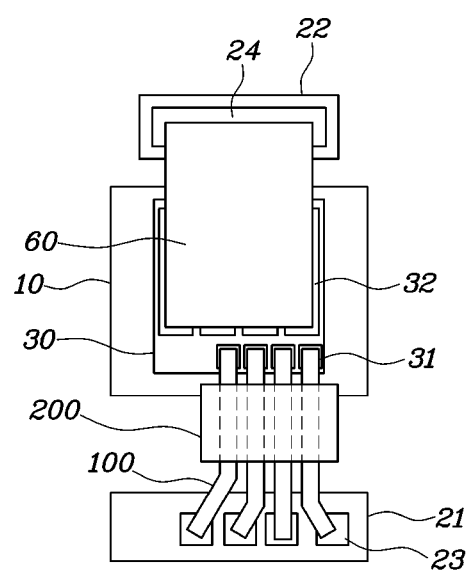
FIGS. 8A to 8C are exemplary views showing signal blocks coupled to respective semiconductor chips according to exemplary embodiments of the present invention.
Figure 8B:
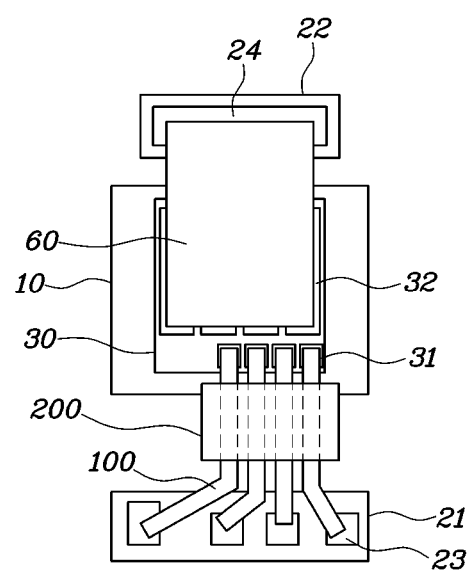
Figure 8C:
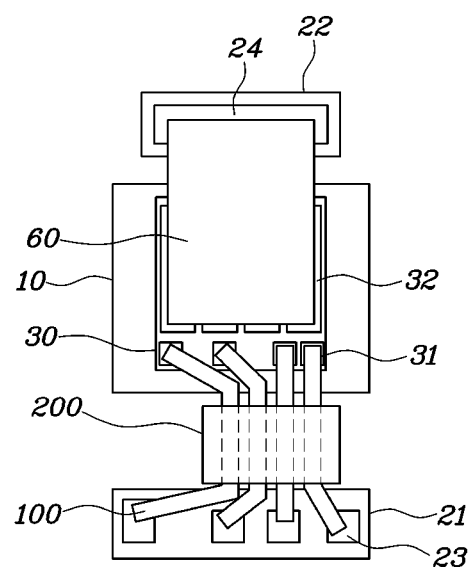

In other words, as shown in FIG. 7A and FIG. 7B, each end portion of the signal clip 110, 120, 130, 140 may be bent in the horizontal direction. As shown in FIG. 7C and FIG. 7D, the signal clip 100 may be bent in the vertical direction. This transformation of the shape of the end portion of the signal clip 100, as shown in FIGS. 8A to 8C may be required since the locations of the first and second signal pads 31 and 23 disposed on the semiconductor chip 30 and on the signal lead frame 21 may be adjusted. For example, signal clips 100 with different shapes may be required based on the locations of signal pads 23 and 31.

The shape of the end portion of the signal clip 100 may be transformed when coupled to the semiconductor chip 30. Alternatively, a signal clip 100 with a previously transformed shape based on the shapes of the semiconductor chip 30 and the signal lead frame 21 may be connected both to the semiconductor chip 30 and to the signal lead frame 21. In particular, by using the signal block prepared in advance, the signal line between the signal lead frame 21 and the semiconductor chip 30 may be formed in an efficient manner. Accordingly, the process of manufacturing signal blocks may be simplified and productivity of the signal blocks may be improved.

Further, the signal clip 100 may be formed of a thin copper ribbon. When using the signal clip 100 made of the thin copper ribbon signal transmission may occur without loss due to the low resistance and high electrical conductivity of copper. Additionally, the insulator 200 may have thickness greater than the thickness of each signal clip 100 to cover the central portions of the signal clips 100. Further, a width of the insulator 200 may be greater than the sum of widths of the plurality of signal clips 100. Due to the structural characteristics of the insulator 200, the plurality of signal clips 100 may be prevented from having contact with the board 10. Additionally, the insulator 200 may be fixed to the board 10 and the connection between of the signal clips 100 and the first and second pads 31 and 23 may be maintained more stably.

Hereinbelow, a double-faced cooling power module using the above-described signal block will be described. In the double-faced cooling power module a semiconductor chip may be disposed between two boards. A signal line and a power line may be connected to the semiconductor chip. In a conventional power module, due to the arced phenomenon of aluminum wires a spacer to widen the gap between the boards is provided. Unlike the conventional power module, in the present invention, signals and power may be configured to be transmitted using clips without wires and the thickness of the power module may be reduced.

Figure 4:
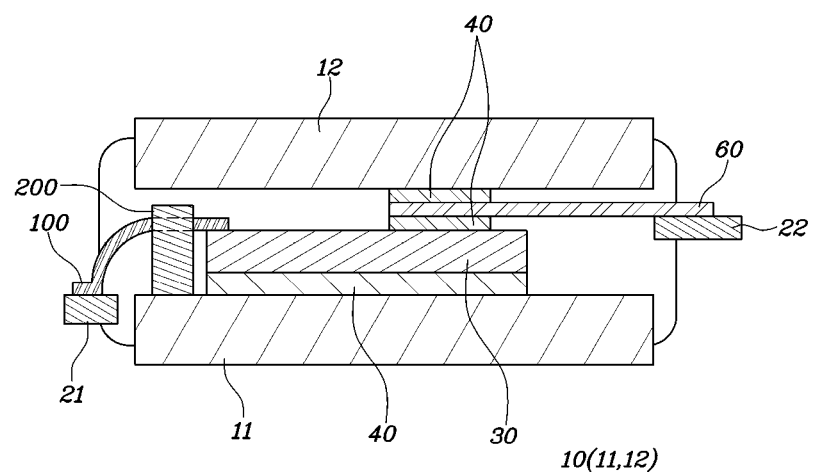
FIGS. 4 to 6 are exemplary views showing double-faced cooling power modules according to exemplary embodiments of the present invention.
Figure 5:
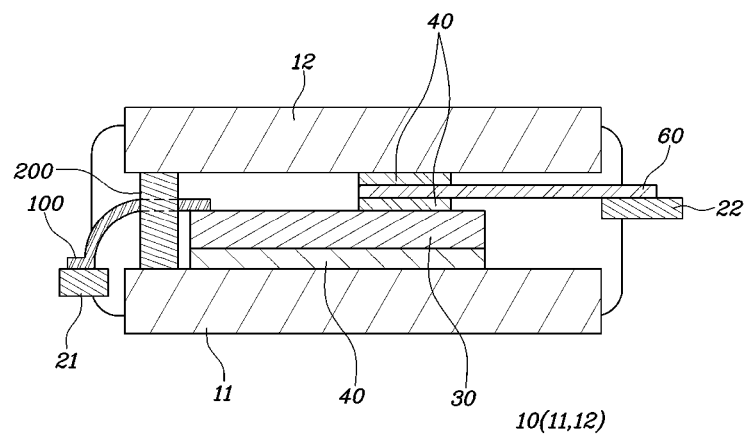
Figure 6:
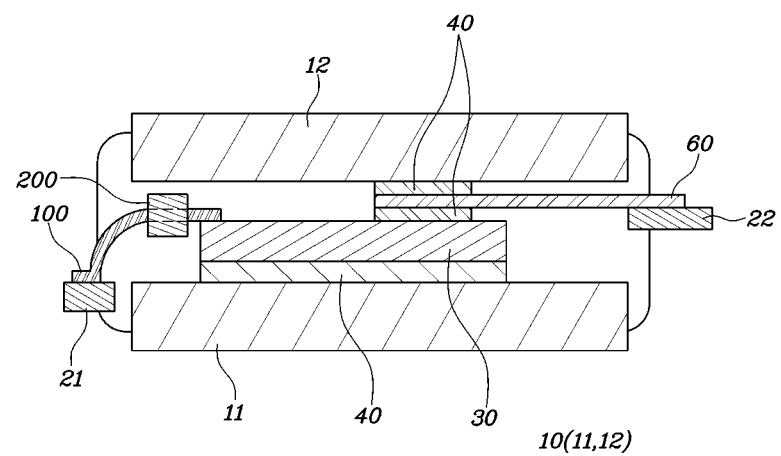

Referring to the configuration of the double-faced cooling power module, as shown in FIGS. 4 to 6, a semiconductor chip 30 may be disposed between a first board 11 and a second board 12. A power clip 60 and signal clips 100 may both be connected to the semiconductor chip 30. For example, the signal clips 100 may maintain positions spaced apart from each other by the insulator 200. Furthermore, the signal clips may be prevented from having contact with the first and second boards 11 and 12.

As shown in FIGS. 4 to 6, the insulator 200 may be coupled to either or both of fast board 11 and second board 12, or may be coupled to neither board. Examples of various forms of the first and second signal pads 31 and 23 formed on the semiconductor chip 30 and on the signal lead frame 21 and examples of forms of signal clips 100 transformed according to the forms of the signal pads 31 and 23 are shown in FIGS. 8A to 8C. In particular, the shape of a first end portion of each signal clip 100 may be configured to transform to correspond (e.g., be bent or moved) to the location of an associated first signal pad 31 formed on the semiconductor chip 30. Further, the shape of the second end portion of the signal clip 100 may be configured to transform or correspond to the location of an associated second signal pad 23 formed on the signal lead frame 21. Accordingly, the signal clips 100 may efficiently connect the semiconductor chip 30 and the signal lead frame 21 to each other. As described above, a signal block having signal clips 100 with transformed ends may be produced in advance in accordance with the shapes of the semiconductor chip 30 and the signal lead frame 21 The production time of the double-faced cooling power module may be reduced and the total thickness of the power module may be reduced by replacing wires with clips when assembling the elements of the double-faced cooling power module.

Although an exemplary embodiment of the present invention has been described for illustrative purposes, those skilled in the art will appreciate that various modifications, additions and substitutions are possible, without departing from the scope and spirit of the invention as disclosed in the accompanying claims. Therefore, the exemplary embodiments described above are intended to be illustrative in all respects to be understood as non-limiting. The scope of the exemplary embodiments described above should be construed to be represented by the claims below rather than the foregoing description, the meaning and scope, and all changes or variations derived from the equivalent concept of the appended claims are included within the scope of the present invention.

What is claimed is:

1. A signal block for a power module, comprising:
   a plurality of signal clips formed in a ribbon shape that connect first signal pads formed on a semiconductor chip and second signal pads formed on a lead frame; and
   an insulator that fixes the position of the plurality of signal clips while spacing the signal clips apart from each other,
   wherein the insulator covers central portions of the plurality of signal clips and exposes opposite ends of each of the signal clips, and
   wherein the insulator does not contact the semiconductor chip and the lead frame.

2. The signal block of claim 1, wherein each of the signal clips is formed in a copper ribbon and spaced apart from a board connected to the semiconductor chip.

3. The signal block of claim 2, wherein the insulator has a width greater than a sum of widths of the plurality of signal clips and has a greater thickness than each of the signal clips, to prevent contact of the plurality of signal clips with the board.

4. The signal block of claim 3, wherein the insulator is coupled to the board.

5. A double-faced cooling power module with a semiconductor chip disposed between first and second boards, comprising:
   a signal block including:
      a plurality of signal clips formed in a ribbon shape that connect first signal pads formed on a semiconductor chip and second signal pads formed on a lead frame;
      an insulator that fixes the position of the plurality of signal clips while spacing the signal clips apart from each other; and
   a power clip coupled to the semiconductor chip and configured to supply electric power,
   wherein the insulator covers central portions of the plurality of signal clips and exposes opposite ends of each of the signal clips, and
   wherein the insulator does not contact the semiconductor chip and the lead frame.

6. The power module of claim 5, wherein the signal clip is formed in a copper ribbon and is spaced apart from the first and second boards.

7. The power module of claim 5, wherein:
   the signal clip includes:
      a plurality of signal clips, wherein a first end of each of the signal clips is coupled to the semiconductor chip and a second end of each of the signal clips is coupled to the lead frame, and
   the signal block includes an insulator that fixes the position of the plurality of signal clips while spacing the signal clips apart from each other.

8. The power module of claim 7, wherein the insulator has a width greater than a sum of widths of the plurality of signal clips, and has a thickness greater than each of the signal clips, and is disposed to prevent contact of the plurality of signal clips with the first and second boards.

9. The power module of claim 7, wherein the semiconductor chip includes:
   a plurality of first signal pads disposed on a first side of a flat surface; and
   a power pad disposed on a second side of the flat surface.

10. The power module of claim 8, wherein the insulator is coupled to either or both of the first and second boards.

11. The power module of claim 9, wherein: the lead frame includes: a plurality of second signal pads on a surface thereof, wherein the semiconductor chip is coupled to a flat surface of the first board, the power clip is coupled to the power pad, and the second board is coupled to a flat surface of the power clip, and
   wherein the plurality of signal clips connects the plurality of first signal pads and the plurality of second signal pads to each other, respectively.

* * * * *